United States Patent [19]

Van As et al.

[11] Patent Number: 5,636,164

[45] Date of Patent: Jun. 3, 1997

[54] GATE ARRAY FOR ACCELERATING ACCESS TO A RANDOM ACCESS MEMORY

[75] Inventors: Harmen Van As; Hans Schindler, both of Langnau am Albis, Switzerland; Wolfram Lemppenau, Fellbach, Germany

[73] Assignee: International Business Machines Corporation, Armonk, N.Y.

[21] Appl. No.: 448,083

[22] Filed: May 23, 1995

Related U.S. Application Data

[62] Division of Ser. No. 216,570, Mar. 22, 1994, Pat. No. 5,515,265.

[30] Foreign Application Priority Data

Mar. 25, 1993 [EP] European Pat. Off. .............. 93810215

[51] Int. Cl.[6] ........................................................... G11C 11/34
[52] U.S. Cl. ........................... 365/189.08; 326/39; 326/40
[58] Field of Search ........................ 365/189.08; 326/39, 326/40

*Primary Examiner*—David C. Nelms
*Assistant Examiner*—F. Niranjan
*Attorney, Agent, or Firm*—John J. Timar

[57] ABSTRACT

An apparatus for rapidly determining a control parameter $t=t_0$ at which the sum S of n functions $F_i$ ($i=1, \ldots n$) reaches a minimum, a maximum, or a given value, wherein each function $F_i(t)$ changes its first derivative only at given discrete values $t_{ij}$ of the control parameter t is described. The apparatus has a random access memory (RAM) addressed by the values $t_{ij}$, a circuit for summing the second derivatives of the functions, a circuit to perform a double integration to evaluate S, and a comparator to determine the optimum control value; also disclosed is a new gate array (GA) which rapidly reproduces the addresses used to address the RAM while skipping all others. This gate array is advantageously used as a part of the apparatus for determining a control parameter. Further, the use of the devices in a communication network is described.

6 Claims, 6 Drawing Sheets

GATE ARRAY FOR ACCELERATING ACCESS TO A RANDOM ACCESS MEMORY

This is a divisional of application Ser. No. 08/216,570 filed on Mar. 22, 1994 now U.S. Pat. No. 5,515,265.

FIELD OF THE INVENTION

The present invention relates in general to a communication systems and apparatus for determining a control parameter $t_0$ at which the sum S of n functions $F_i(t)$ (i=1, ..., n), reaches a minimum, a maximum, or a given value, wherein each function $F_i(t)$ is changing or is assumed to change its first derivative only at given discrete values $t_{ij}$ of the parameter t. It is concerned particularly, but not exclusively, with means to determine the optimum threshold value in a scheduling process to achieve throughput fairness between the users of a ring or bus-based communication system protocolled by cyclic reservation multiple access (CRMA). A function which changes its first derivative only at discrete values is also known as being piecewise linear. A piecewise linear function is linear within successive intervals of non-zero length, the borders of which are identical with the discrete values of $t_{ij}$ at which it changes its first derivative. Its second derivative, therefore, consists of discrete impulse functions, also known as Dirac or delta ($\delta$-) functions. Also disclosed is a gate array which may be used in the apparatus.

BACKGROUND OF THE INVENTION

Though the basic principles of evaluating the extreme values of a given function are known, increasing demand exists for apparatus able to perform such evaluation at increased speed. The demand arises from different technical fields, such as process control and communication network control. In these technical fields, often a physical or technical parameter is observed as a function of time or space. These functions or their derivatives serve as input to a control unit, such as a microcomputer or the like.

After evaluating the input measurement, the control unit activates or instructs the subsequent operating units. Part of the evaluation process often includes a min–max problem or a comparison of the values of the measured function to a given reference value. In general, these problems are solved by known numerical techniques or algorithms cast into a code executable by the controlling processor. The speed of these known techniques crucially depend on the instruction cycle time of the microprocessor.

Although this cycle time has been significantly decreased in the past, real-time applications demand a higher execution speed than known programmed general purpose processors can provide. One important example of such a high-speed application relates to communication networks, where data transfer rates are approaching the Gbit/s (billion bits per second) region. Specific types of networks are described in the following background as the examples. However, due to its general applicability, the scope of the invention is not restricted to this specific technical field.

In a communication network, multiple users or nodes are interconnected by at least one transmission medium. Transmission media include twisted pairs of wire, baseband and broadband coaxial cable, and optical fibers. Depending on the technical field, names like bus, channel, tree, net, or ring are used to characterize the mode or topology in which the users are connected by said transmission media. Examples for these networks are electronic components of a computer interconnected by a bus and the networks known as LAN or MAN. Local area networks (LANs) are described, for example, in Computing Surveys, Volume 16, No. 1, March 1984, pages 3–41. Metropolitan area networks (MANs) are described, for example, in IEEE Communications Magazine, Volume 24, No. 1, January 1986, pages 9–14.

Participation of multiple users in a network requires schemes and devices for controlling the access of the users to the network for directing the data from the sending or calling user to the receiving user, for preventing the loss of data, and the like. These schemes are generally known as medium access control protocols. Protocolling may be performed by one (centralized system) or several (distributed system) devices connected to the network. Depending on the type of network, protocols, like carrier sensing multiple access (CSMA), token bus, token ring, register insertion, and slotted ring are known. Several of these protocols are described in the reference cited above.

One specific type of protocol is known as cyclic reservation multiple access (CRMA), extensively described in LAN 92, Ninth Annual EFOC/LAN Conference, London, June 1992, pp. 162–169.

A major task of a protocol is to guarantee a fair access of all users or nodes to the connecting network by predetermined criteria. These criteria may include the designation of priorities to certain nodes, the balance between heavy users of the network and occasional users, and managing access loads that exceed the maximum throughput of the network.

To fulfill its tasks, a protocol heavily depends on microcontrollers and algorithms to optimize the network's overall performance. In U.S. Pat. No. 4,630,264, for example, algorithms for a CSMA protocol with collision detection are disclosed. The calculations according to these algorithms often form the bottleneck of the network's throughput capacity.

OBJECTS OF THE INVENTION

It is, therefore, an object of the invention to provide means for rapidly determining a control parameter $t_0$ at which the sum S of n functions $F_i(t)$ (i=1, ... n) reaches a minimum, a maximum, or a given value, wherein each function $F_i(t)$ is changing or is assumed to change its first derivative only at given discrete integer values $t_{ij}$ of t.

Further, it is an object of the invention to provide a method and means to improve the control of a computer network.

It is a specific object of the invention to accelerate the scheduling of resources in a network.

More specifically, it is an object of the invention to provide a method and means for a rapid determination of the optimum threshold for the cycle length or the number of confirmed access requests from nodes within a network working according to a CRMA protocol.

BRIEF SUMMARY OF THE INVENTION

This invention provides a circuit comprising a random access memory (RAM), means for adding and restoring values in the RAM, a gate array, a double integrating circuit, and a comparator designed and connected to determine a control parameter value $t_0$ at which a sum S of piecewise linear functions $F_i$ reaches either its maximum, its minimum, or a given reference value. To a person skilled in the art, it is known that the single measured or otherwise calculated function does not necessarily have to be piecewise linear in a strictly mathematical sense, as long as it can be treated as such with a sufficient decree of accuracy.

The order in which the following steps are presented does not necessarily reflect the sole way of executing the invention. However, it should be understood as a preferred mode of carrying out the invention.

First, the input numbers of values which are presumed to be known for the purpose of this invention are applied to a RAM and to a gate array, respectively.

As a sum S of n piecewise linear functions $F_i$ is to be evaluated, the following notation is used: Index i ranging from 1 to n denotes one of the n functions F to be added. Another index j ranging from 0 to a value $m_i$ denotes the discrete values of the ith function F. The value $m_i$ may vary, depending on the ith function. Thus, any of the functions F to be added is sampled as a set of pairs of values $(F_{ij}(t_{ij});t_{ij})$ with $0 \leq j \leq m_i$. The function value $F_{ij}$ corresponds to an integer value $t_{ij}$ of the control parameter t, which is definable as an independent variable. The $m_i$ pairs of values $(F_{ij}(t_{ij});t_{ij})$ consists of all points at which the function $F_i$ changes its slope, i.e., its first derivative. In other words, each function $F_i(t)$ is linear over an interval banded by two consecutive values of $t_{ij}$.

But within the scope of the invention, the pairs $(F^{}_{ij}(t_{ij});t_{ij})$ are supplied as input, rather than the pairs $(F_{ij}(t_{ij});t_{ij})$. $F^{}(t)$ denotes the value of the second derivative of a function F at a value t. Techniques to evaluate the second derivative of a piecewise linear function are known to those skilled in the art and are, therefore, not discussed in this description. As being the second derivative of piecewise linear function, the $m_j$ pairs $(F^{**}_{ij}(t_{ij});t_{ij})$ form a sequence of Dirac pulses, also known as pulse or impulse functions, or δ-functions.

The $t_{ij}$ are applied to the address entries of the RAM. The data entries of the RAM are connected to means for adding the contents of the addressed memory location to the input value $F^{}_{ij}(t_{ij})$ currently applied, and restoring the result at the same memory location. This step is repeated for all n functions $F_i$. Thus, the RAM is loaded with a value $F^{}_{ij}(t_{ij})$ or a sum $S^{**}(t_{ij})$ of these values, if a value of $t_{ij}$ happens to be equal for two or more functions $F_i$.

After all values have been stored in the RAM, in the next step of the process, a fast double integration is performed. The speed of the integration depends to a large extent upon the specially designed gate array GA.

The gate array keeps track of all the addresses applied to the RAM and is able to reproduce these addresses consecutively, i.e., it produces with each strobe or clock pulse, the next higher address or value $t_{ij}$ at which a second derivative $F^{}_{ij}$ or a sum $S^{}(t_{ij})$ of the second derivatives has been stored in the RAM.

The gate array marks each used address either directly or after performing an additional test based on Boolean operations, such as equals, less than, larger than, and combinations thereof. A mark denotes a certain state of a memory cell or a latch attached to the addressing lines. The readout of the GA is, in its fastest embodiment, enabled by applying a clock or strobe pulse only. With each pulse, the next address is produced by the gate array. Addresses not used are skipped. AS the output lines of the GA are connected to the address lines of the RAM, only those memory locations are addressed to which entries have been made in the previous step.

The double integrating circuit connected to the RAM and the gate array evaluates consecutively the value of the sum S of the n functions $F_i$ at all $t_{ij}$. It preferably comprises means for calculating the difference between two consecutive addresses $t_{ij}$ produced by the gate array. This difference is taken as an interval in which S exhibits a constant slope. It further preferably comprises a first adder and register in which the addressed contents of the RAM, i.e, the sum of the second derivatives $F^{**}_{ij}(t_{ij})$, is consecutively accumulated. This accumulated sum is consecutively multiplied with the length of the interval. The output of the multiplier is again accumulated in a second register, the contents of which is consecutively fed into the comparator circuit.

The comparator enables the determination of the smallest (largest) value of S and the value $t_{ij}$ corresponding to it. A modified comparator can be used to determine the $t_{ij}$ at which $F_{ij}(t_{ij})$ exceeds or is about to exceed a given reference value.

The invention is further defined in the appended claims.

BRIEF DESCRIPTION OF THE DRAWINGS

The invention is described by way of example with reference to the drawings, which are schematic and not drawn to scale. They only show the basic devices, whereas standard peripheral components are left out for the sake of simplicity.

DETAILED DESCRIPTION OF THE PREFERRED EMBODIMENT

The preferred embodiment will be illustrated and explained by way of example. The first example describes a solution to the problem of finding an optimum control parameter value $t_0$ at which a sum of piecewise linear functions $F_i$ approaches a given threshold value. To simplify the description, an example is chosen in which each function $F_i$ changes its slope only once from +1 to 0. The example is a simplified application of a cyclic reservation multiple access protocol of a computer network with ring topology as described in LAN 92, Ninth Annual EFOC/LAN Conference, London, June 1992, pp 162–169.

In order to keep the access time within well defined boundaries, the control unit of the network, i.e., the headend, attempts to generate cycles that are equally long, while guaranteeing fairness, i.e., giving each node the same right to access the network. The length of a cycle is measured in slots.

Figure 1:
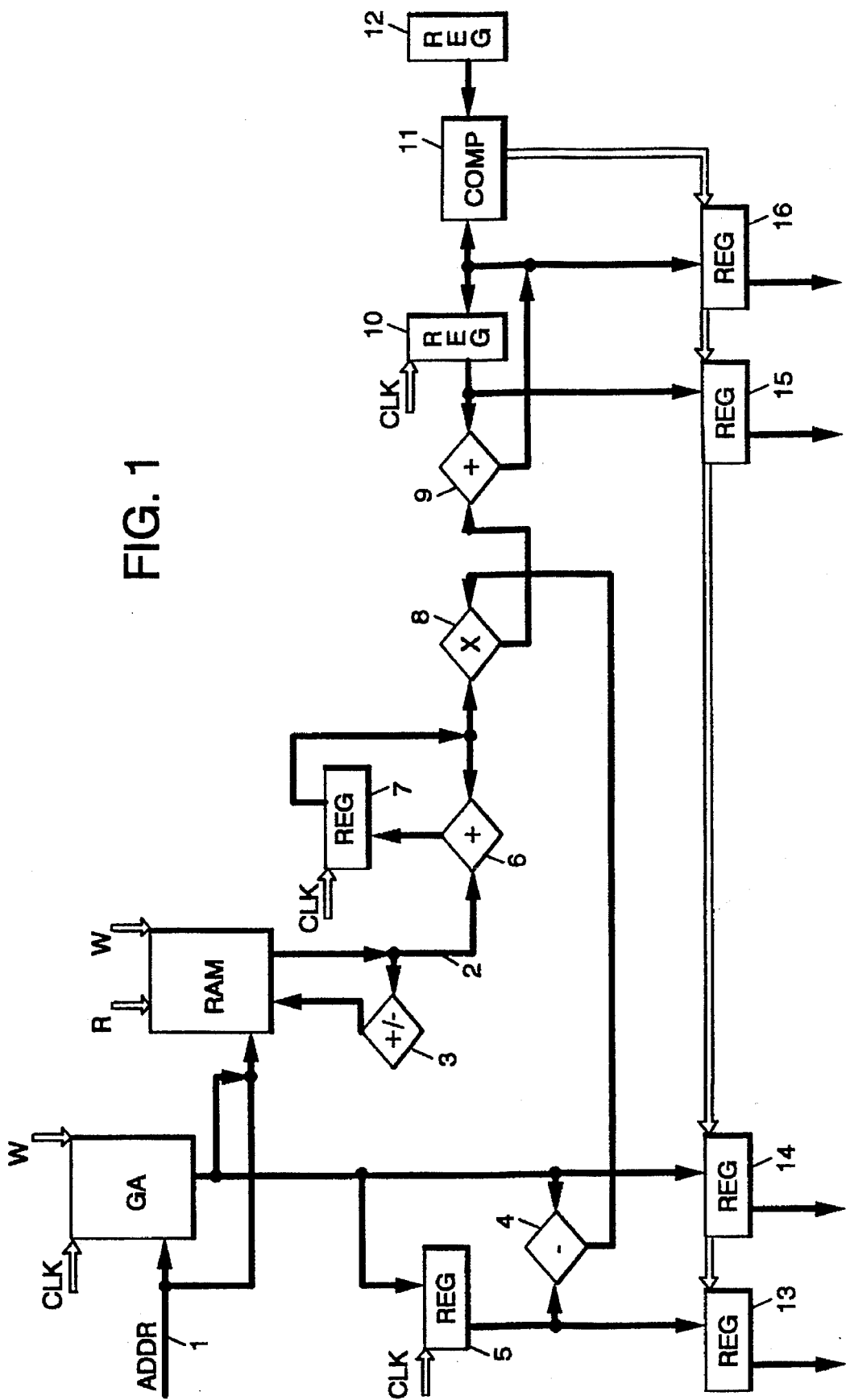
FIG. 1 shows a circuit according to the invention designed to determine the control parameter at which the sum of piecewise linear functions reaches a given reference value.
Figure 1A:
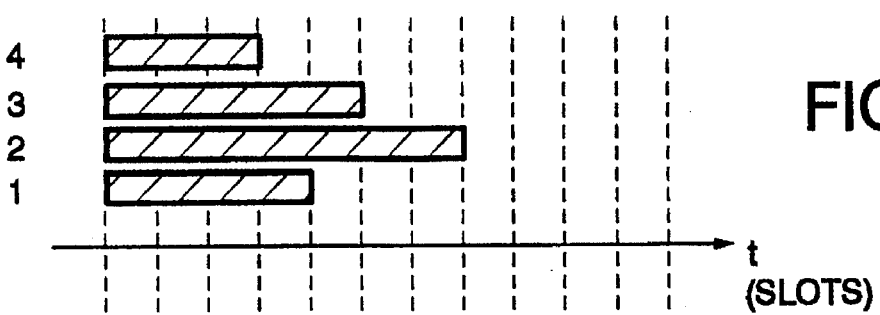
FIG. 1A shows the demand measured in slots of four nodes in a protocolled network.

In the example, it is assumed that four nodes (node 1, 2, 3, and 4) of the network report a demand of 4, 7, 5, and 3 slots, respectively, to the headend (see FIG. 1A). For implementing the new apparatus, each demand and their sum is treated as a function of a threshold parameter t. The threshold parameter t sets the limit for the number of slots actually reserved or confirmed in the next cycle for each demanding node. A threshold value of t=7 would allow all four nodes to obtain all their slots within the next cycle. The length of this cycle equals the sum of all demanded slots, which is 19, exceeds the optimum cycle length which supposedly is 17 for the present example. Thus, for achieving the optimum cycle length, the threshold value t has to be lowered. The new apparatus allows the fast determination of the threshold value $t_0$ corresponding to the optimum cycle length.

As described above, the demand of each node can be seen as a piecewise linear function $F_i$ ($1 \leq i \leq 4$) of the threshold value t. The slope of this function $F_i(t)$ is 1 in the interval from 0 to the value of t which equals the number of slots demanded by node i. For all values of t above this number, the slope changes to 0. The second derivative of the function $F_i(t_i)$ of node 1 is, therefore, described by two pairs of values $(F**_{1j}(t_{1j});t_{1j})$ with j=1, 2, i.e, (+1;0) and (−1;4) or, in other words, by two Dirac functions with the height of +1 and −1, respectively. The demands by the other nodes are, thus, described by (+1;0) and (−1;7) (+1;0) and (−1;5), (+1;0) and (−1;3), respectively.

Figure 1B:
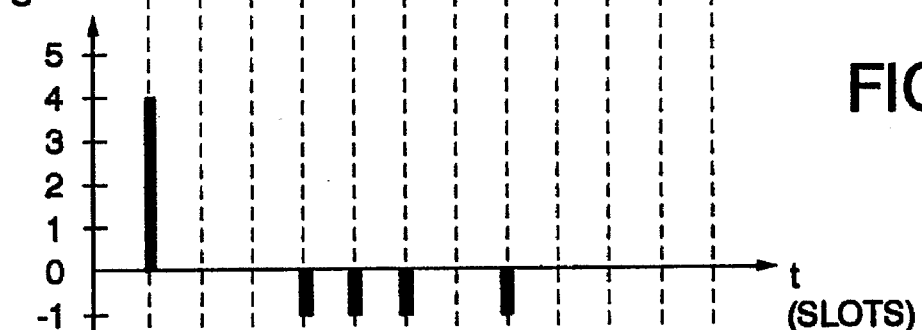
FIG. 1B shows the sum of the second derivatives of the demands of FIG. 1 as a function of the threshold.
Figure 1C:
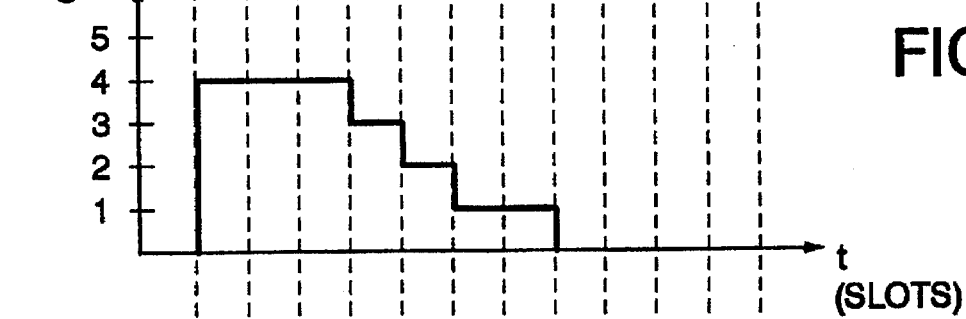
FIG. 1C shows the first integral of the sum of the second derivatives as shown in FIG. 1B.
Figure 1D:
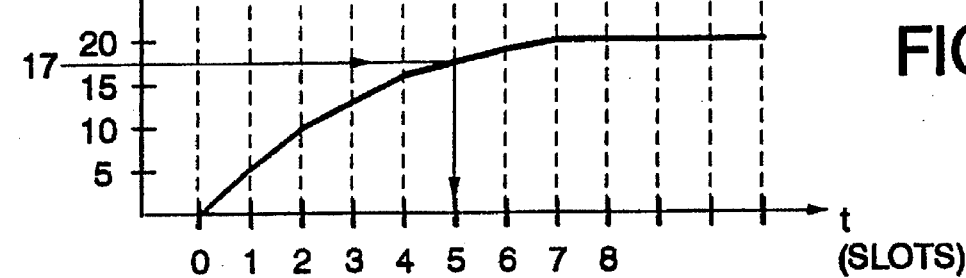
FIG. 1D shows the second integral of the sum of second derivatives as shown in FIG. 1B, which equals the sum of the demands of the nodes as a function of the threshold as shown in FIG. 1A.

The main components of the implementation of the new invention are shown in FIG. 1. Using this apparatus, first, the Dirac pulses are added, and then, the summed Dirac pulses are integrated two times. The results of these steps are illustrated by FIGS. 1B–D.

For adding the second derivatives $F**_{1j}(t_{1j})$ (j=1,2) only the gate array GA, the RAM, and the incrementer/decrementer 3 of the whole circuit are active. The value zero and the demanded number of slots (3, 4, 5, and 7) are applied via address lines 1 to the gate array Ga and the random access memory RAM for each node, consecutively. Thus, the addresses are 0 and 4 for the first node, 0 and 7, 0 and 5, and 0 and 3 for nodes 2 to 4, respectively. In the described example, the input of the second derivative is done by the help of the incrementer/decrementer 3, as the slope of each function only changes by an amount of 1. The contents of the memory location in the RAM addressed by zero is incremented by 1, whereas the value of the other memory locations is decremented by 1 for all nodes. After the input of all nodes has been applied to the RAM, a value 4 is stored at address 0, a value −1 at the address 3, 4, 5, and 7 for the given example. This result is displayed by FIG. 1B in the form of a function of the parameter t. During this summation process, the gate array GA keeps track of all addresses at which an entry has been made, i.e., 0, 3, 4, 5, and 7. A specific description of the GA used in this example is given below.

After the input from all nodes has been stored, accordingly, the cycle length values just above and below the desired cycle length, together with the corresponding threshold value are computed.

The gate array, when strobed, will consecutively output all of the addresses at which a value has been entered. Thus, the sequence 0, 3, 4, 5, and 7 will be applied to the circuit as shown in FIG. 1. By means of a subtracter circuit 4, the difference between consecutive addresses is obtained. As said above, these values correspond to the ends of a section of constant slope of the function S which is the sum of all four functions $F_i$ and denotes the length of the cycle. The register 5 serves as storage for the previous value $t_{ij}$ needed for the subtraction.

The output from the gate array is also used to address the RAM. The RAM will output the sum of Dirac pulses as stored at the addressed memory locations, This sum corresponds to a difference in the slope of S. The differences in slope are integrated by means of an adder 6 and a register 7, resulting in the slope values S* of S. Again, the slope values of S are displayed in FIG. 1C as a function of the threshold t.

To perform the second integration, these slope values S* are multiplied in the following multiplier circuit 8 with the value from the subtracter 4. These operations results in the difference between two consecutive values at the upper and lower end of a linear segment of the function S. By summing all these difference values with the help of another adder 9 and a register 10, all discrete values of the function S itself are consecutively obtained. FIG. 1D shows S as a function of t. By comparing FIGS. 1A and 1D, it can be verified that S is the sum of the demands of all four nodes treated as function of t.

As soon as the calculated cycle length value exceeds the desired cycle length value (17) stored in register 12, a load pulse stores the cycle length just above and just below the desired value in the registers 16 and 15, together with the corresponding threshold values, which are stored in register 14 and 13. At this point, one of the two threshold values or a value derived by linear interpolation between the two values may be selected. For the simplified example, 5 has been determined as optimum threshold value $t_0$.

Since the multiplier is the slowest element in the chain, and since today's multipliers exhibit multiplication times of 50 ns or less, the threshold can easily be derived in less than 1 μs (assuming 16 active nodes).

In the second example, the functions change their slope three times. The technical background is a modified scheduling algorithm for the cyclic reservation multiple access (CRMA) protocol as described in paper 5.2.3 of the Ninth Annual EFOC/LAN Conference, London, June 199, pp 162–169. Herein, a scheduler cyclically issues a RESERVE command and analyzes the returning parameters which the nodes connected to the network have inserted. The parameters consists of two parts: one transmit-count to indicate the number of slots, i.e., the amount of data, already transmitted without being corrected to a fairness threshold value $t_0$ issued by the scheduler; and one request-count to indicate the number of slots a node wishes to reserve for the next cycle.

Based on this information returned by each node of the network, the scheduler has to determine a fairness threshold $t_0$. All slots demanded by the nodes which lie beneath this fairness threshold are confirmed, whereas an equivalent number of all slots being reported as transmission above the threshold are to be deferred. The threshold is set to a level at which the sum of confirmations and deferments for all nodes becomes minimal. This criterion achieves the highest network throughput while guaranteeing throughput fairness to the individual nodes.

Figure 2A:
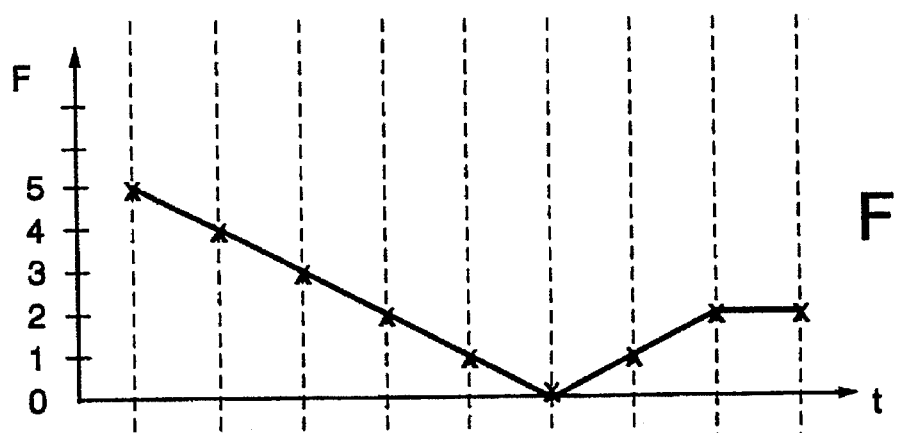
FIGS. 2A–C show a cycle length (in slots) and its first and second derivatives of one node as a function of the threshold parameter t.
Figure 2B:
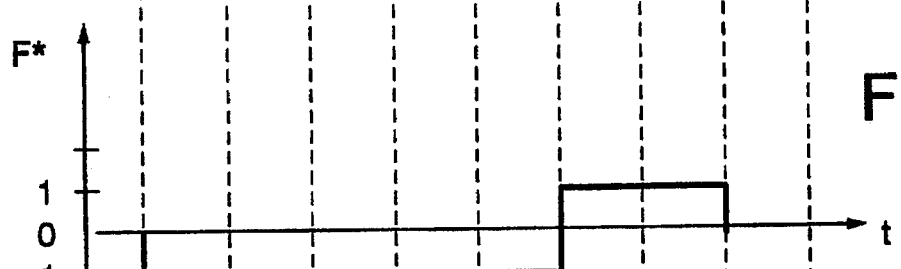

FIG. 2A shows the functions $F_i$ construed from two parameters, i.e., the number of transmitted slots and the number of requested slots for one node as a function of the fairness threshold t. The function shows a piecewise linear behavior. As long as the threshold lies below the number of transmitted slots of the node, which is 5 in the example, the function has a slope of −1. When the fairness threshold reaches this number, the slot changes to +1. The total change of slope at that value, thus, is 2, as depicted in FIG. 2B. With the value of the threshold exceeding the sum of transmitted and requested slots, the function becomes constant, i.e., the slope assumes the value 0. The second derivative, therefore, becomes −1.

Figure 2C:
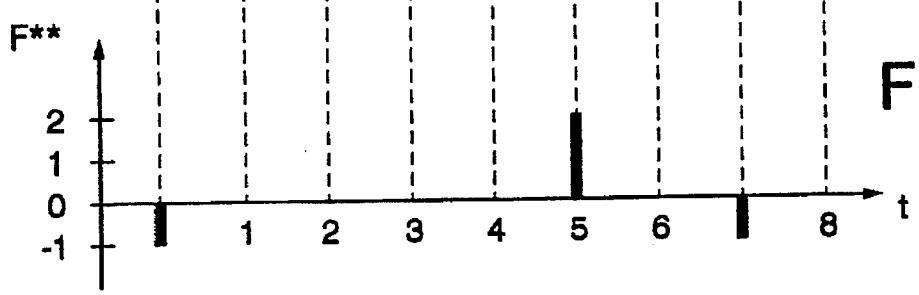

As can be seen from FIG. 2C, the second derivative of the function $F_i(t)$ is described by three discrete pairs $(F^{**}_{ij}(t_{ij}); t_{ij})$ for each node. These pairs are (−1;0) (2;5), and (−1;7) for the one node illustrated by FIGS. 2A–C.

Figure 3:
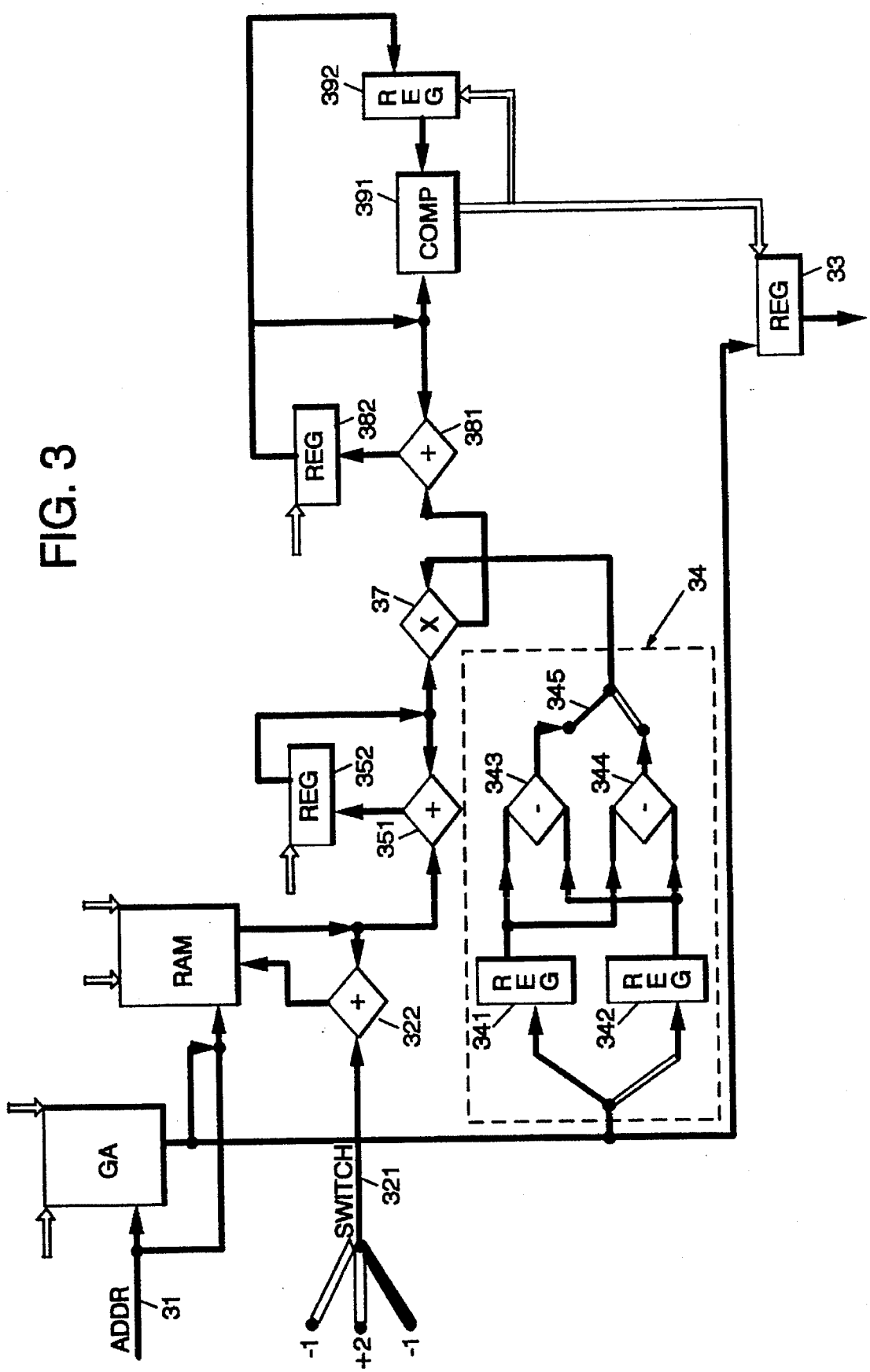
FIG. 3 shows a circuit according to the invention designed to determine the control parameter at which the sum of piecewise linear functions reaches a minimum value.

As illustrated by FIG. 3, these pairs are consecutively applied to the RAM and the gate array GA. The $t_{ij}$ are connected to the common address bus 31 and the $F^{**}_{ij}(t_{ij})$ via the adder 322 to the data bus of the RAM. Using the example of FIGS. 2A–C, first, the address 0 is applied and the −1 as change of slope is added to the RAM. Secondly, the value +2 is added at address 5 of the RAM. In a third step, the value −1 is added at address 7.

As the changes of slope (−1, −2, −1) are the same for all piecewise functions of the described example, these values are applied to the adder 322 by using a threefold switch 321, which changes the applied value in accordance with the current value of t. After this summation is completed for all nodes, a double integration is performed on the stored values. The remainder of FIG. 3 illustrates the integration circuit: The GA loads one of the register 341, 342, the RAM and the optimum threshold register 33 consecutively with all values of the parameter $t_{ij}$ which have been used in the previous step to address the RAM. As described in the first example, all other addresses are skipped by the gate array. The second of the two registers 341, 342 is designed to store the previous value of t of the threshold. Together with the substracters 343, 344, both registers perform a fast evaluation of the interval length between both threshold values as being needed for the integration. The input lines and the output lines of this subtracter circuit 34 are switched alternately. The double integration circuit 351, 352, 37, 381, 382 has already been described above. The comparator 391 executes a continuous comparison of the current value of S with it previous value stored in register 392. (As in the first example, S shortly denotes the sum of the function $F_i$.) The comparator 391 loads register 392 whenever a new value for S is smaller than the previously stored value and it additionally controls the loading of register 33, which holds the optimum threshold value.

To compare the speed of the new method to known techniques (microcontroller), it is assumed that the microcontroller operates at 10 MHz rate i.e., it needs 100 ns per instruction cycle. A software implementation, including one loop operation for each possible threshold value with a nested loop to sum the contribution of each node at the fixed threshold value, takes approximately 15000 instruction cycles for a threshold range from 0 to 100 and 50 active nodes within the network. Thus, a computation time of 1.5 ms is required to find the optimum threshold, whereas the new method calculates the optimum threshold under the same conditions in 9.5 µs. This enables the calculation of an optimum threshold value even during a few slot units of one cycle in a CRMA controlled network operating at 2.4 Gbit/s with a slot and header length of together 68 bytes.

Example of the Gate Array

The new gate array is designed to consecutively reproduce all addresses $t_{ij}$ used to store the second derivatives in the RAM while skipping all other addresses. It has the capability to accelerate the complete readout of a random access memory. Within the scope of the invention, it significantly enhances the speed of the integration procedure.

Figure 4:
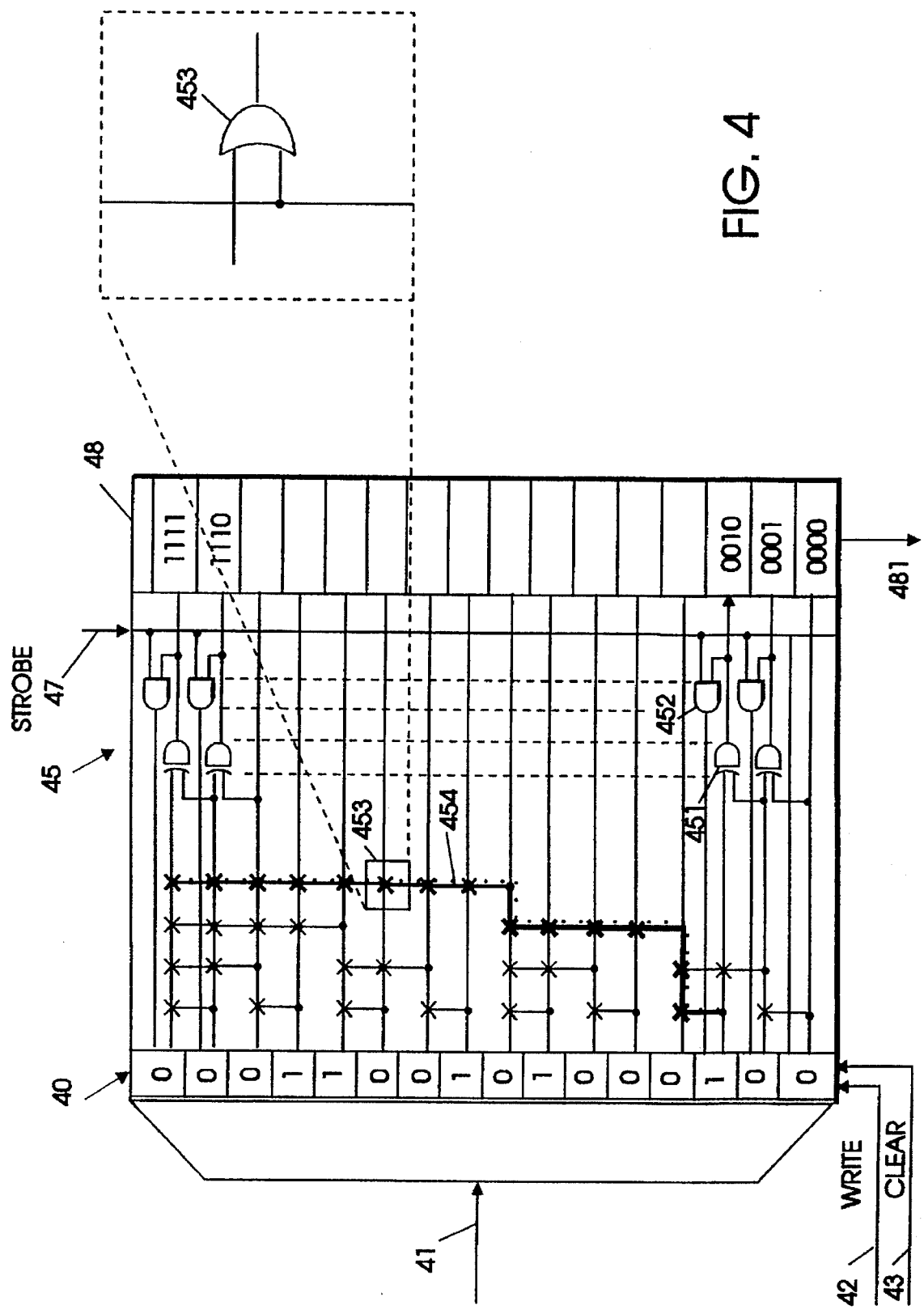
FIG. 4 shows an implementation of the gate array according to the invention.

As shown in FIG. 4, the addresses are applied via lines 41 to the 1-bit wide RAM section 40 of the gate array to activate one memory cell. Entries to a memory cell are made by the write and clear lines 42, 43.

During the loading step, all memory cells of the gate array which are addressed are set to binary "1". This marks the use of the corresponding address. The others are left on "0".

The outputs of the memory cells are connected by OR-gates x, one of which is shown enlarged (453). Thus, the "1" in the cell with the lowest address is applied to all internal lines above. In the example, the signal migrates along path 454. After passing an OR-gate, each output line is applied to an exclusive OR- or (XOR-) gate 451. (For the sake of clarity, not all of the gates are shown in the figure.) The XOR-gate ensures that only the lowest memory cell containing a binary "1" activates an address (0010) stored in a read-only memory section 48 of the gate array. When a strobe pulse is applied at line 47, the marked memory cell with the lowest address is set to "0" by the output of AND-gate 452. As a result, the next higher address marked is activated, as all output lines below are set to "0". This procedure repeats itself with each strobe pulse applied until all marked addresses have been made available to the output 481 of the gate array. The pulse duration must exceed the minimal response time of the AND-gate 452.

Figure 5:
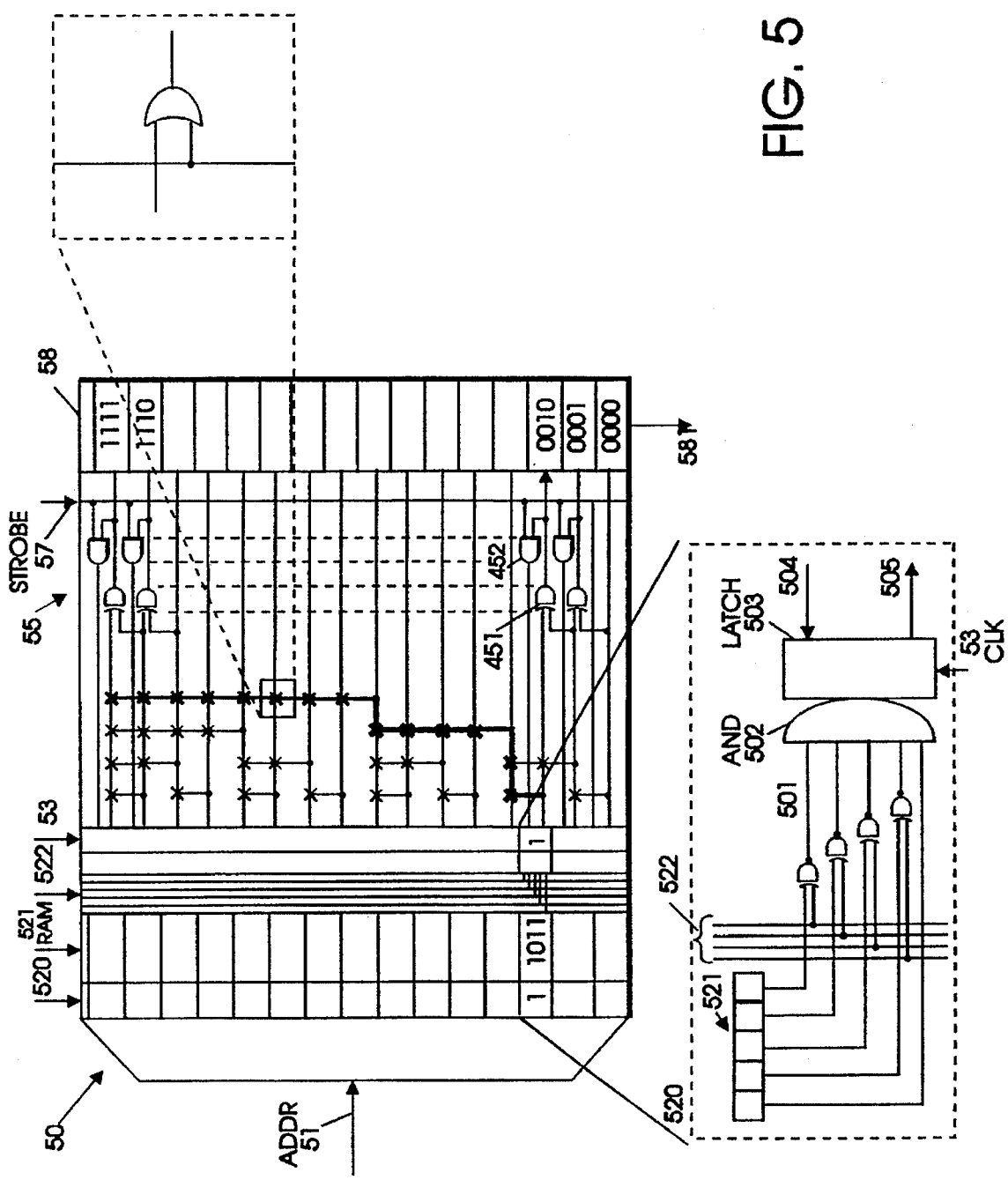
FIG. 5 shows a modification of the gate array of FIG. 4.

In the example illustrated by FIG. 5, the gate section 55 and the ROM section 58 are identical to the corresponding sections 45 and 48 of the previous example. This embodiment of the gate array differs in the entry section 50. By means of an additional n-bit wide storage section and a corresponding n-fold XOR array, a further selection criterion is established.

The section 50 comprises an additional random access memory 521 (4-bit wide), in which an appropriate key or match word can be stored. To mark a certain address location, the address has to be applied via lines 51, and simultaneously the match word is stored in 521. Used addresses can now be searched with an additional criterion of match to a key entered at lines 522. By using the inverted XOR-gates 501, the entries 522 are compared in parallel to the data stored in 521. The latch 503 is only set by a clock pulse via 53, if a location has been addressed and a match occurs. The lowest activated latch is reset by a strobe pulse applied via line 57, an AND-gate 502, and line 504. The remaining parts of the gate array have been already described in the first example.

We claim:

1. A gate array for consecutively reproducing all addresses applied to said gate array, comprising:

a first section comprising means to erasably mark each address applied, a first plurality of gates to pass a signal of a lowest marked address while blocking the signals of all other addresses;

a second section comprising a read only memory from which is outputted an address stored in said read only memory activated by the signal of the lowest marked address passed through said first plurality of gates, and a second plurality of gates to erase the marking of the lowest marked address in said first section by applying a pulse of sufficient duration to said second plurality of gates.

2. The gate array in accordance with claim 1, wherein the first section comprises random access memory cells and/or resettable latches.

3. The gate array in accordance with claims 1 or 2, further comprising a plurality of OR-gates connecting the signal of the lowest marked address to signal lines of all higher addresses and a plurality of XOR-gates connecting the outputs of said OR-gates for each pair of consecutive signal lines.

4. The gate array in accordance with claim 3, comprising a plurality of AND-gates connecting a strobe line and the signal lines which are connected to the address section, one output of said AND-gates is used to erase the marking of the lowest marked address.

5. The gate array in accordance with claim 4, wherein the first section additionally comprises means to establish a further test criterion based on one or more Boolean operations.

6. The gate array in accordance with claim 5, wherein the first section additionally comprises:

means for storing a key word; input lines for applying a search word, means for comparing the applied search word in parallel with the stored key word and indicating a match; and means for marking an address which has been applied only if a match between the stored key word and the search word occurs.

* * * * *